(12) United States Patent
Pei

(10) Patent No.: US 8,757,606 B2
(45) Date of Patent: Jun. 24, 2014

(54) LOADING DEVICE FOR COATING PROCESS

(75) Inventor: Shao-Kai Pei, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 480 days.

(21) Appl. No.: 13/172,872

(22) Filed: Jun. 30, 2011

(65) Prior Publication Data

US 2012/0298034 A1 Nov. 29, 2012

(30) Foreign Application Priority Data

May 26, 2011 (TW) .............................. 100118402 U

(51) Int. Cl.
*B23Q 3/00* (2006.01)
(52) U.S. Cl.
USPC ...................................... 269/289 R; 29/281.1
(58) Field of Classification Search
USPC ......... 269/289 R, 302.1, 21, 20.71, 900, 903; 29/281.1
See application file for complete search history.

(56) References Cited

U.S. PATENT DOCUMENTS

| | | | | |
|---|---|---|---|---|
| 5,906,539 A * | 5/1999 | Tabel | | 451/403 |
| 6,012,711 A * | 1/2000 | Cipolla | | 269/21 |
| 6,637,737 B1 * | 10/2003 | Beecherl et al. | | 269/71 |
| 6,834,425 B2 * | 12/2004 | Budig et al. | | 29/791 |
| 2006/0123612 A1 * | 6/2006 | Wiseman et al. | | 29/281.1 |
| 2012/0298034 A1 * | 11/2012 | Pei | | 118/500 |

* cited by examiner

*Primary Examiner* — Lee D Wilson
(74) *Attorney, Agent, or Firm* — Novak Druce Connolly Bove + Quigg LLP

(57) ABSTRACT

A loading device which is used in coating processes includes a base, a loading plate, and a reversing assembly. The base includes an outer frame and a ring-shaped inner frame rotatably positioned on the outer frame. The loading plate defines a number of holes for loading components. The reversing assembly connects the inner frame to the loading plate. The reversing assembly includes two reversing motors and two shafts. The reversing motors are opposite to each other and fixed on the inner frame. The reversing shafts are opposite to each other and positioned in a straight line. One end of each reversing shaft is coupled with a corresponding reversing motor, the other end of each reversing shaft is fixed on the loading plate. The reversing shafts are driven by the reversing motors to reverse the loading plate relative to the inner frame.

11 Claims, 4 Drawing Sheets

LOADING DEVICE FOR COATING PROCESS

BACKGROUND

1. Technical Field

The present disclosure relates to loading devices for coating processes.

2. Description of Related Art

A number of optical elements need to be coated on two surfaces thereof. However, vacuum coating devices usually coat one surface at one time, then the optical elements must be manually reversed to coat the other surface, by opening or otherwise manipulating the vacuum coating device, which is time-consuming and an inefficient production technique.

Therefore, it is desirable to provide a loading device for a coating process that can overcome the above-mentioned limitations.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
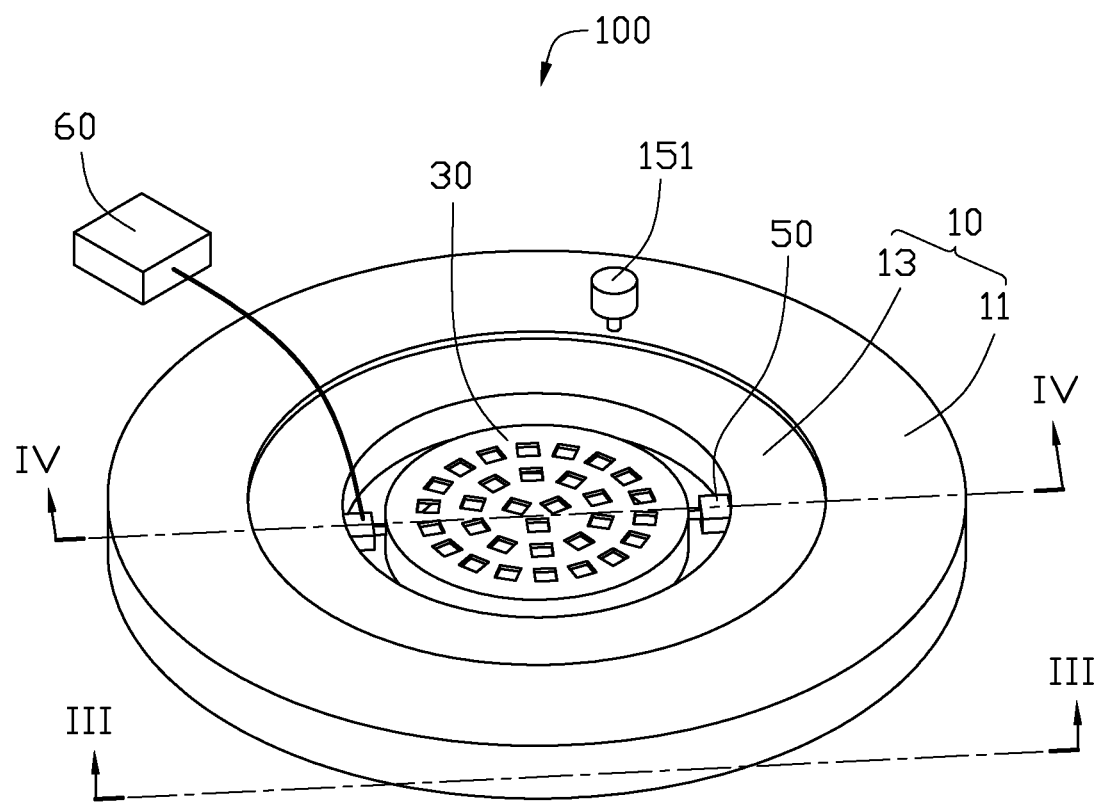
FIG. 1 is a schematic view of a loading device for a coating process, according to an exemplary embodiment.

Referring to FIG. 1, a loading device 100 is used for loading a number of elements (not shown) which must undergo a coating process, according to an exemplary embodiment. The loading device 100 includes a base 10, a loading plate 30, a reversing assembly 50, and a controller 60.

Figure 2:
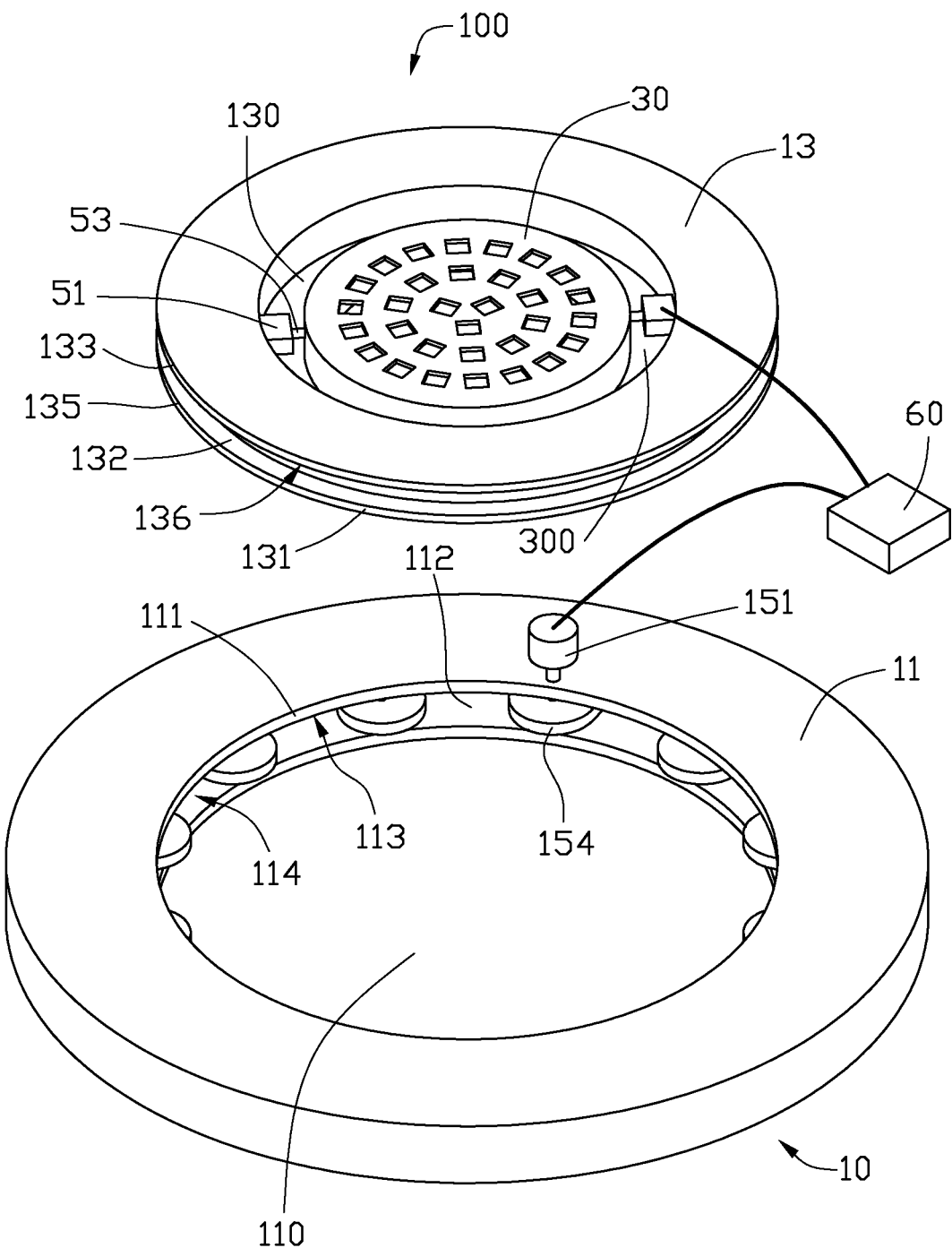
FIG. 2 is a schematic exploded view of the loading device of FIG. 1.
Figure 3:
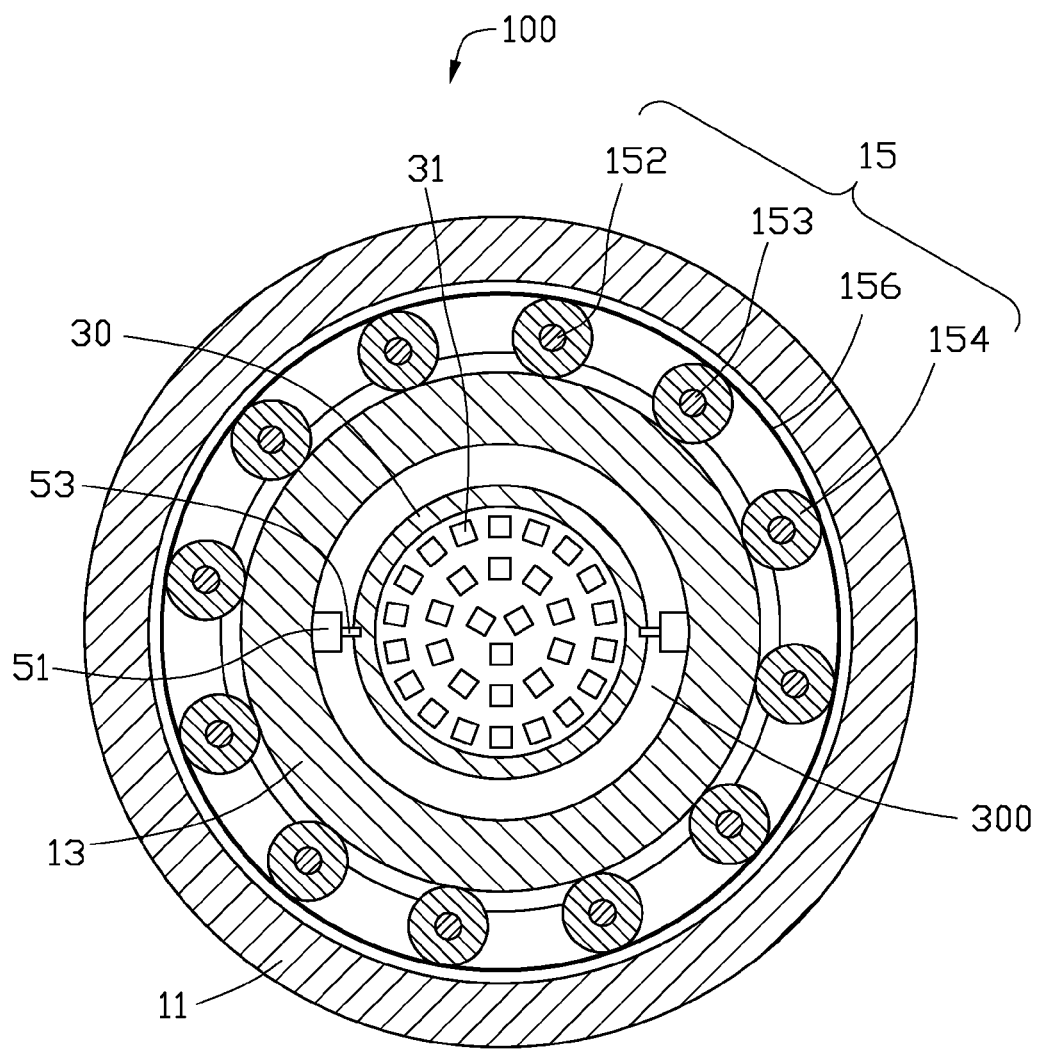
FIG. 3 is a cross-sectional view taken along a line III-III of the loading device of FIG. 1.

Also referring to FIGS. 2&3, the base 10 includes a disk-shaped outer frame 11, a disk-shaped inner frame 13, and a rotating assembly 15.

The outer frame 11 is fixed in a working space (not shown) from which the air has been evacuated, and has a first through hole 110 at the center thereof and a ring-shaped inner sidewall 111. The inner sidewall 111 defines a deep groove 112 within the circumference thereof. The groove 112 includes an internal top surface 113 and an internal bottom surface 114.

The outer diameter of the inner frame 13 is equal to that of the first through hole 110, therefore the inner frame 13 can be concentrically received in the first through hole 110. The inner frame 13 defines a second through hole 130 concentric with the first through hole 110. The inner frame 13 includes an outer sidewall 131 positioned so as to face the groove 112. The outer sidewall 131 defines a slot 132 around the circumference thereof. The slot 132 is bounded by a top plate 133 and a bottom plate 135. The top plate 133 has a resisting surface 136 facing the bottom plate 135. The bottom plate 135 rests on the inner surface of the outer frame 11, which limits the free rotation of the inner frame 13, and lubrication of these bearing surfaces is required to reduce friction.

The rotating assembly 15 includes a rotating motor 151, an active shaft 152, a number of passive shafts 153, a number of rotating plates 154, and a transmission belt 156.

The rotating motor 151 is disposed on the outer frame 11. The active shaft 152 and the passive shafts 153 are rotatably disposed between the top surface 112 and the bottom surface 113 of the outer frame 11, and cooperatively form a circle which partially intrudes into the first through hole 110 and is concentric with it. One end of the active shaft 152 passes through the top surface 112 to couple with the rotating motor 151, thereby the rotating motor 151 can drive the active shaft 152 to rotate. The rotating plates 154 respectively sleeve on the active shaft 152 or the passive shafts 153, and extends out of the slot 132 to be received in the first through hole 110. The transmission belt 156 has an anti-skid surface bearing against the sidewalls of the rotating plates 154, and can achieve synchronous rotation of the active shaft 152 and the passive shafts 153.

Figure 4:
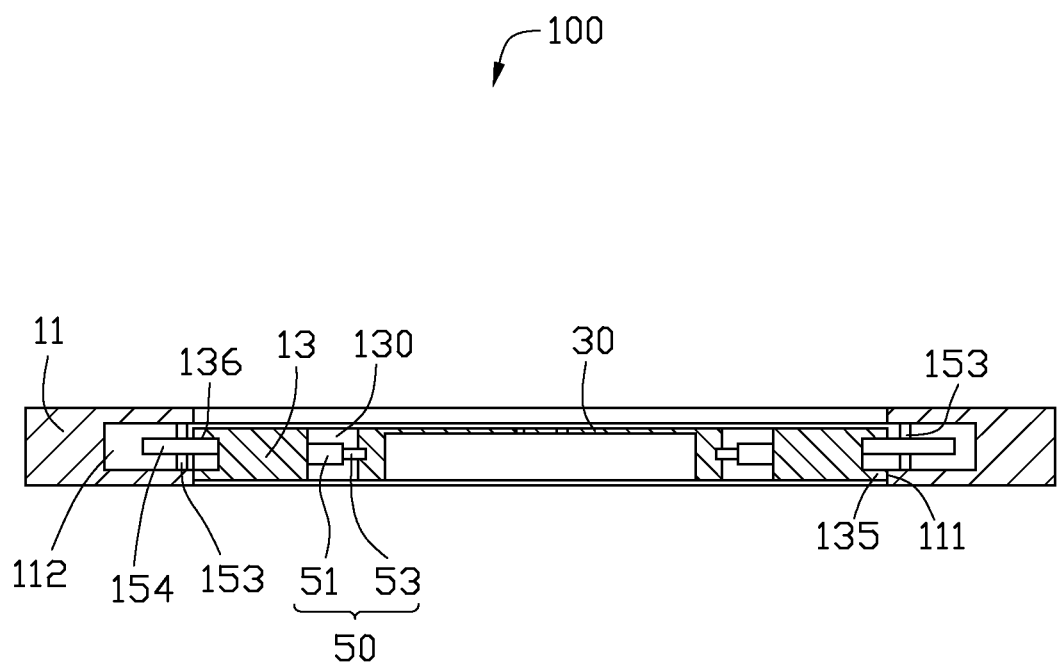
FIG. 4 is a cross-sectional view taken along a line IV-IV of the loading device of FIG. 1.

Also referring to FIG. 4, friction between the resisting surface 136 and the rotating plates 154 causes the inner frame 13 to rotate. The surface of the resisting surface 136 is anti-skid.

Referring to FIGS. 3-4, the loading plate 30 is circular and defines a number of loading holes 31 used for loading elements. The outer diameter of the loading plate 30 is less than the inner diameter of the second through hole 130, and thus the loading plate 30 is received in the second through hole 130 to form a gap 300 between the inner frame 13 and the loading plate 30.

The reversing assembly 50 is disposed in the gap 300, and is used to reverse the direction of motion of the loading plate 30 in the inner frame 13. The reversing assembly 50 includes two reversing motors 51 opposite to each other and two reversing shafts 53 respectively coupled with the corresponding reversing motors 51. The two reversing motors 51 are fixed on the inner frame 13 diametrically opposite each other, and the motor shafts (reversing shafts 53) are used to drive the loading plate 30 in reverse.

The controller 30 is electrically connected to the rotating motors 151 and the two reversing motors 51 to activate the motors 151 and 51 cooperatively.

In use, the elements (not shown) are fixed in the loading holes 31, the outer frame 11 is in a working space (not shown) in a vacuum. A first coating surface of the elements faces a target (not shown), the controller 30 controls the rotating motor 151 to rotate the inner frame 13 until a uniform coating on the first coating surface has been achieved. The controllers 30 controls the reversing motor 51 to drive the loading plate 30 to reverse relative to the inner frame 13, and present the second coating surface of the element to the target. The controller 60 controls the rotating motor 151 until the second coating surface has been coated.

The numbers of the active shaft 152, the passive shaft 153 and the rotating motor 151 are not limited to this embodiment.

In other embodiments, the transmission belt 156 also can be omitted, and a number of motors and passive shafts 153 can be mounted to the loading device 100.

In other embodiments, the reversing motor 51 can be disposed on the top plate 132 or the bottom plate 133 of the inner frame 13.

In other embodiments, the outer frame 11 can have other shapes, e.g. cuboid or prism.

It will be understood that the above particular embodiments are shown and described by way of illustration only. The principles and the features of the present disclosure may be employed in various and numerous embodiments thereof without departing from the scope of the disclosure as claimed.

The above-described embodiments illustrate the scope of the disclosure but do not restrict the scope of the disclosure.

What is claimed is:

1. A loading device comprising:
 a base comprising:
  an outer frame defining a first through hole at the center thereof, and
  an disk-shaped inner frame rotatably received in the first through hole and coaxial with the outer frame;
 a loading plate defining a plurality of loading holes for fixing a plurality of elements; and
 a reversing assembly connecting the loading plate to the inner frame and configured for driving the loading plate to reverse relative to the inner frame, and comprising:
  two reversing motors opposite to each other and fixed on the inner frame;
  two reversing shafts opposite to each other and positioned in a straight line, one end of each reversing shaft coupled with a corresponding reversing motor, the other end of each reversing shaft fixed on the loading plate, the two reversing shafts capable of being driven by the two reversing motors to reverse the loading plate relative to the inner frame.

2. The loading device of claim 1, wherein a diameter of the inner frame is equal to that of the first through hole.

3. The loading device of claim 1, wherein the inner frame defines a second through hole at the center thereof, a diameter of the loading plate is less than the second through hole to define a gap between the inner frame and the outer frame, the reversing assembly is received in the gap.

4. The loading device of claim 1, wherein the base further comprises a rotating assembly connecting to the inner frame and configured for driving the inner frame to rotate relative to the outer frame.

5. The loading device of claim 4, wherein the rotating assembly comprises at least one rotating motor, at least one active shaft, and a plurality of passive shafts, a plurality of rotating plates, and a transmission belt, an inner sidewall of the outer frame defines a groove along the circumstance direction thereof, the at least one active shaft and the passive shafts are rotatably positioned in the groove to form a circle adjacent to the first through hole, each of the rotating plates is sleeved on a corresponding one of the active shaft and the passive shafts, received in the groove and partially extends in the first through hole, the rotating plates resist on the loading plate, the at least one motor is fixed on the outer frame, and is connected to the at least one active shaft to drive the at least one active shaft to rotate, the transmission belt sleeves the rotating plates to make the rotating plates synchronously rotating.

6. The loading device of claim 5, wherein the transmission belt has an anti-skid surface bearing against the rotating plates.

7. The loading device of claim 5, wherein an outer sidewall of the inner frame defines a slot along the circumstance direction thereof, the slot comprises a top plate resisting on the rotating plates.

8. The loading device of claim 7, wherein the surface of the top plate contacting the rotating plates is anti-skidding.

9. The loading device of claim 7, wherein the slot further comprises a bottom plate opposite to the top plate, the bottom plate resists on an inner surface of the outer frame.

10. The loading device of claim 9, wherein the bottom plate of the inner frame and the inner surface of the outer frame are lubricated.

11. The loading device of claim 10, wherein the loading device further comprises a controller electrically connected to the at least one rotating motor and the reversing motors, and the controller is configured for controlling the at least one rotating motor and the reversing motors to work cooperatively.

* * * * *